(12) United States Patent
Alhussien et al.

(10) Patent No.: US 9,548,128 B2
(45) Date of Patent: Jan. 17, 2017

(54) READ RETRY FOR NON-VOLATILE MEMORIES

(71) Applicant: Seagate Technology LLC, Cupertino, CA (US)

(72) Inventors: AbdelHakim S Alhussien, San Jose, CA (US); Erich F Haratsch, San Jose, CA (US); Sundararajan Sankaranarayanan, Freemont, CA (US); YingQuan Wu, Palo Alto, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/961,865

(22) Filed: Dec. 7, 2015

(65) Prior Publication Data
US 2016/0093396 A1 Mar. 31, 2016

Related U.S. Application Data

(63) Continuation of application No. 14/135,837, filed on Dec. 20, 2013, now Pat. No. 9,209,835.
(Continued)

(51) Int. Cl.
*H03M 13/03* (2006.01)
*G11C 16/28* (2006.01)
(Continued)

(52) U.S. Cl.
CPC ........... *G11C 16/28* (2013.01); *G11C 11/5642* (2013.01); *G11C 16/08* (2013.01); *G11C 16/26* (2013.01);
(Continued)

(58) Field of Classification Search
CPC .. H03M 13/1125; H03M 13/09; H03M 13/19; H03M 13/1515; G11C 11/5642; G11C 29/028; G11C 29/026; G11C 16/28; G11C 8/12; G11C 11/5621; G11C 29/54; G11C 2029/04; G06F 11/1068; G06F 11/1048; G06F 12/00; G06F 13/1102; G06F 11/1012; G06F 11/1008
See application file for complete search history.

(56) References Cited

U.S. PATENT DOCUMENTS

8,830,750 B1 * 9/2014 Cheng ..................... G11C 16/26
365/185.09
8,924,824 B1 * 12/2014 Lu ......................... G06F 11/1048
365/185.2
(Continued)

*Primary Examiner* — Guerrier Merant
(74) *Attorney, Agent, or Firm* — Cesari & Reed, LLP; Kirk A. Cesari (57) ABSTRACT

An apparatus for reading a non-volatile memory includes a tracking module operable to calculate means and variances of voltage level distributions in a non-volatile memory and to calculate at least one reference voltage to be used when reading the non-volatile memory based on the means and variances, a likelihood generator operable to calculate at least one other reference voltage to be used when reading the non-volatile memory, wherein the at least one other reference voltage is based at least in part on a predetermined likelihood value constellation, and to map read patterns from the non-volatile memory to likelihood values, and a read controller operable to read the non-volatile memory using the at least one reference voltage and the at least one other reference voltage to yield the read patterns.

16 Claims, 3 Drawing Sheets

Related U.S. Application Data (60) Provisional application No. 61/909,447, filed on Nov. 27, 2013.

(51) Int. Cl.
    *H03M 13/11*     (2006.01)
    *G11C 11/56*     (2006.01)
    *G11C 29/02*     (2006.01)
    *G11C 16/08*     (2006.01)
    *G11C 16/26*     (2006.01)
    *G11C 29/42*     (2006.01)
    *G11C 29/44*     (2006.01)

(52) U.S. Cl.
    CPC ........... *G11C 29/026* (2013.01); *G11C 29/028* (2013.01); *G11C 29/42* (2013.01); *H03M 13/1125* (2013.01); *G11C 2029/4402* (2013.01); *H03M 13/1117* (2013.01)

(56) References Cited

U.S. PATENT DOCUMENTS

| | | | |
|---|---|---|---|
| 2012/0008386 A1* | 1/2012 | Chilappagari | G11C 11/5642 365/185.2 |
| 2012/0213001 A1* | 8/2012 | Yang | G06F 11/1048 365/185.2 |
| 2012/0224420 A1* | 9/2012 | Sakurada | G11C 8/08 365/185.03 |
| 2012/0240007 A1* | 9/2012 | Barndt | H03M 13/1108 714/758 |
| 2012/0265927 A1* | 10/2012 | Cho | G11C 11/5642 711/103 |
| 2014/0355340 A1* | 12/2014 | Sharon | G11C 16/26 365/185.03 |
| 2015/0085571 A1* | 3/2015 | Hu | G11C 16/26 365/185.03 |

\* cited by examiner

READ RETRY FOR NON-VOLATILE MEMORIES

CROSS REFERENCE TO RELATED APPLICATIONS

The present application claims priority to (is a non-provisional of) U.S. Pat. App. No. 61/909,447, entitled "Non-Volatile Memory With Channel Tracking-Based Retry Read Voltage", and filed Nov. 27, 2013 by Alhussien et al, the entirety of which is incorporated herein by reference for all purposes.

FIELD OF THE INVENTION

Various embodiments of the present invention provide systems and methods for adjusting retry read voltage in a non-volatile memory based on channel tracking to improve the quality of soft decisions to be used in soft decoding.

BACKGROUND

Non-volatile memories such as flash memory can be used to store data in a wide range of different applications, such as a solid state disk (SSD). Data is read from the non-volatile memory in blocks referred to herein as a "read unit" or as a "codeword" that is protected from error by included error correction, such as included parity bits generated using an error correction algorithm such as low density parity check (LDPC) encoding. In some cases, each read unit contains approximately 4K to approximately 32K bits of user data, plus error correction bits. Under command of a solid state disk controller, those bits are read from non-volatile memory cells, e.g., via an array access. The resulting data is decoded to apply the error correction algorithm, for example in a low density parity check decoder. If the data fails to converge in the low density parity check decoder, a retry operation can be used to re-read the data and to again apply the error correction algorithm. Although cell voltage is continuous, non-volatile memory cells generally provide only binary hard decisions after a read operation. When soft iterative decoding algorithms such as low density parity check decoding are used for error correction, it is desirable to convert the hard decisions generated by the non-volatile memory into soft decisions that give the decoder more information to help correct errors. The soft decisions converted from a single read may not be of sufficient quality for successful decoding. In this case, multiple reads with varying read voltages can be used to obtain sufficient quality of the soft decisions. Thus, the location and frequency of the read reference voltages can directly affect the quality of the soft decision and eventually, the theoretic information content of the channel reads.

BRIEF SUMMARY

Some embodiments of the present invention provide an apparatus for reading a non-volatile memory, including a tracking module operable to calculate means and variances of voltage level distributions in a non-volatile memory and to calculate at least one reference voltage to be used when reading the non-volatile memory based on the means and variances, a likelihood generator operable to calculate at least one other reference voltage to be used when reading the non-volatile memory, wherein at least one other reference voltage is based at least in part on a predetermined likelihood value constellation, and to map read patterns from the non-volatile memory to likelihood values, and a read controller operable to read the non-volatile memory using the at least one reference voltage and the at least one other reference voltage to yield the read patterns.

This summary provides only a general outline of some embodiments according to the present invention. Many other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components.

DETAILED DESCRIPTION OF THE INVENTION

Embodiments of the present invention are related to adjusting retry read voltage in a non-volatile memory based on channel tracking. The channel tracking includes estimating means and variances of the voltage distributions for the different data states in the non-volatile memory. If the low density parity check decoding of retrieved data fails then the non-volatile memory controller enters into a soft low density parity check decoding operation, in which soft data is used as the input to the low density parity check decoder. In retry, multiple reads of a memory page are performed at different read reference voltages to obtain a quantized version of the stored voltage on the cell. Afterwards, the multiple read pattern for each bit is then mapped to a log-likelihood ratio (LLR) that represents the confidence level of the bit value being 0 or 1. Finally, the log-likelihood ratios are passed as the soft data input to the low density parity check decoder to recover the written data. Because log-likelihood ratios are represented by a limited number of bits, such as, but not limited to, 4 bit signed integers, the possible number of log-likelihood ratio values will be very limited (16 in the case of 4 bit signed integers). In the log-likelihood ratios, the sign indicates the decision region (e.g., negative for a 0 value and positive for a 1), and the magnitude indicates the confidence in the decision.

The resolution of the read voltage step is adjusted to effectively use the limited bit-width of the log likelihood ratios. In some embodiments, the multiple read patterns for each bit are mapped to log-likelihood ratios using a look-up table designed to increase the probability of convergence of the low density parity check decoder at early read retries. On average, this improves the system throughput. This ensures that multi-bit patterns are mapped to proper fixed point log-likelihood ratio values compared to the less robust computation of log-likelihood ratios based on uniformly spaced read reference voltages. Notably, although some embodiments use log likelihood ratios, plain likelihood probability values can also be used.

Considered individually, each non-volatile memory cell has a particular stored (programmed) charge that corresponds to a device threshold voltage for that cell, and further corresponds to the logical bit values being stored in the cell. While ideally all of the cells in the non-volatile memory would have identical device threshold voltages for the logical bit values stored, in practice for a variety of reasons the device threshold voltages follow a probability distribution, e.g. a Gaussian distribution. Thus considered in aggregate across a large number of cells, such as of a read unit, there are as many device threshold voltage distributions (e.g., Gaussian probability curves) as there are states per cell (two states per bit of storage per cell). That is, for N-bits per cell of storage, there are $2^N$ states and the same number of device threshold voltage distributions. Thus, $2^N-1$ different read reference voltages may be needed by read circuits in the non-volatile memory to distinguish between the $2^N$ states.

The device threshold voltage distributions vary from their initial/nominal distributions by one or more factors, such as read disturb, write disturb, and retention loss. More particularly, over time, temperature, and other factors related to use, the location of each of the device threshold voltage distribution can change with respect to the device threshold voltage axis. Such changes increase the likelihood of read errors that are performed using a read reference voltage value for the read threshold that was previously established based on the nominal device threshold voltage distribution. In some embodiments, when a hard-decision uncorrectable error is encountered in a read unit read from non-volatile memory, a series of retry operations is performed to recover the read unit. The retry operations include the controller re-reading the read unit with different reference voltages as adjusted based on channel tracking.

The retry read reference voltage adjustment disclosed herein can be applied to both single-level cell (SLC) flash memories, where N=1, and to multi-level cell (MLC) flash memories, where N>1. Single-level cell memories store one bit per cell of storage, have two device threshold voltage distributions (one for zeroes and another for ones), and use a single read threshold, read reference voltage $V_{REF0}$. From lower to higher device threshold voltages, the two device threshold voltage distributions are known as the E (Erased) state and D1 (first Data) state. While arbitrary, a mapping or coding in some embodiments assigns logical one to the E state and logical zero to the D1 state. Thus references to zeroes and ones are proxy references for respective decodings of the D1 state and the E state. Multi-level cell memories store more than one bit per cell, have more than two device threshold voltage distributions, and use multiple different read thresholds to distinguish the distributions. For example, a four level cell memory stores two bits per cell, has four device threshold voltage distributions, and generally uses three read thresholds (read voltage references $V_{REF1}$, $V_{REF2}$, and $V_{REF3}$). From lower to higher device threshold voltages, the four device threshold voltage distributions are known as the E (Erased), D1 (Data1), D2 (Data2), and D3 (Data3) states. While arbitrary, each of the four device threshold voltage distributions is also mapped (addressed) in accordance with a particular binary sequence, such as a Gray code sequence. Thus references to one or more of the 11, 10, 00, and 01 states, are proxy references for respective decodings of the E, D1, D2, and D3 states.

For a single-level memory cell, a tracking module estimates the means and variances of the voltage distributions of states D1 and E, and sets the read reference voltage $V_{REF0}$ based on these distributions. The calculated $V_{REF0}$ will lie at the intersection of the distributions when 0's (state E) and 1's (state D1) are equally likely in the written data. A read control module initiates M data reads of the addressed page from the flash device to the read buffer, with the first read at a read reference voltage of $V_{REF0}$ and the subsequent read reference voltages at different levels around $V_{REF0}$ as determined by channel tracking of the means and variances of the voltage distributions of states D1 and E. For a multi-level memory cell, the tracking module estimates the means and variances of the voltage distributions of all states.

Figure 1:
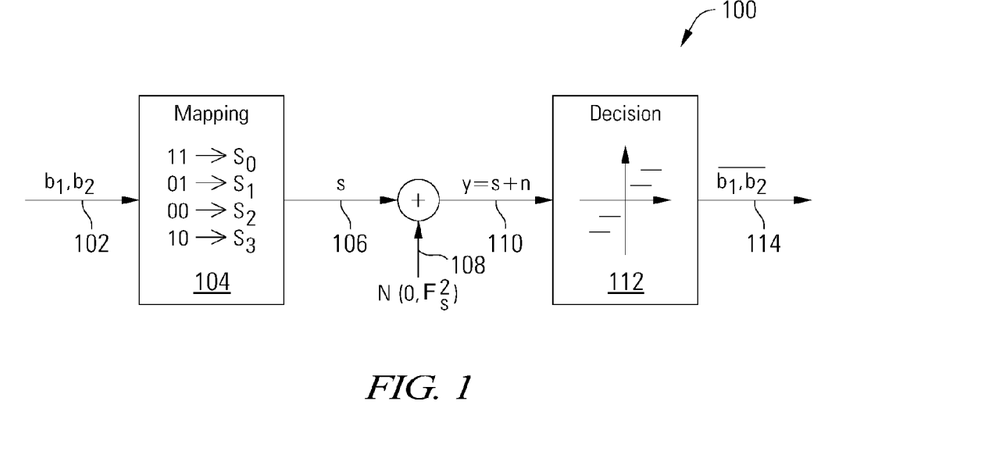
FIG. 1 depicts a model of a non-volatile memory channel in accordance with some embodiments of the present invention.

Turning to FIG. 1, a model of a non-volatile memory channel 100 is depicted in which channel tracking can be used to adjust retry read reference voltage in accordance with some embodiments of the present invention. Notably, two-bit inputs with four states are used in this example, although the retry read reference voltage adjustment disclosed herein is not limited to use with any particular bit width or number of states. For two input data bits 102, the two data bits 102 $b_1 b_2$ can be mapped to four possible states in a mapping 104. For example, value '11' for the two data bits 102 can be mapped to state $s_0$, value '01' to state $s_1$, value '00' to state $s_2$, and value '10' to state $s_3$. For a multi-level cell, the cell is programmed to a selected state 106 from the four states depending on the value of the two data bits 102. As voltages representing the selected state 106 are written to and read from the memory cell, noise 108 is added due to the programming process and other inefficiencies and disturbances, yielding a noisy cell voltage 110 y. The noise can be considered to be an additive white Gaussian noise (AWGN), with the noise variances being different depending on the signal transmitted.

Figure 2:
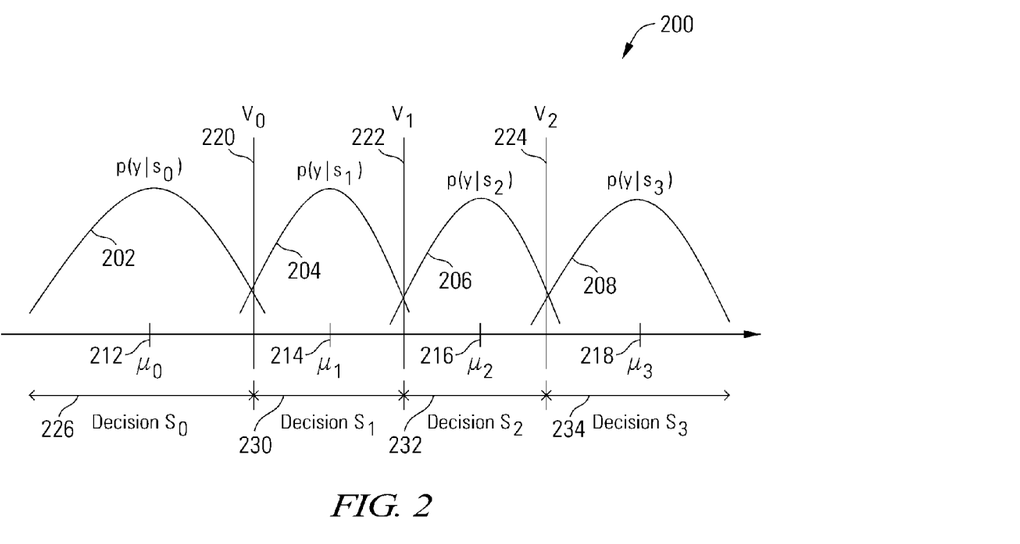
FIG. 2 depicts a graph of cell voltage distributions for a normal hard decision read in accordance with some embodiments of the present invention.

The resulting voltages read from the memory cell thus appear something like the distributions 202, 204, 206, 208 shown in the graph 200 of FIG. 2, rather than four distinct discrete voltage levels corresponding to the four states at the target state voltage levels 212, 214, 216, 218. Each distribution 202, 204, 206, 208 will have a mean roughly equal to the target voltage for the state, and the variance will depend upon the noise. Because the voltages on the memory cell are not accurate, the voltages read back can vary according to the distributions 202, 204, 206, 208. In some embodiments, during the initial read of the memory cell, reference voltages $V_0$ 220, $V_1$ 222 and $V_2$ 224 are used during a read to determine the state of the memory cell, returning hard decisions about the state of the memory cell.

In general, if the readback voltage is below reference voltage 220, a decision (112, FIG. 1) indicates that the memory cell is determined to be in state $s_0$ 226. If the readback voltage is above reference voltage $V_0$ 220 and below reference voltage $V_1$ 222, a decision indicates that the memory cell is determined to be in state $s_1$ 230. If the readback voltage is above reference voltage $V_1$ 222 and below reference voltage $V_2$ 224, a decision indicates that the memory cell is determined to be in state $s_2$ 232. If the readback voltage is above reference voltage $V_2$ 224, a decision indicates that the memory cell is determined to be in state $s_3$ 234.

In some embodiments, the read operation is divided into a process of reading least significant bit (LSB) pages and most significant bit (MSB) pages. States $s_0$ 226 and $s_1$ 230 correspond to a least significant bit value of 1, states $s_2$ 232 and $s_3$ 234 correspond to a least significant bit value of 0. When reading the least significant bit, the reference voltage $V_1$ 222 is applied to the memory cell, and if the voltage on the cell is above reference voltage $V_1$ 222 the least significant bit is interpreted as having a value of 0. If the voltage on the cell is below reference voltage $V_1$ 222 the least significant bit is interpreted as having a value of 1. States $s_0$ 226 and $s_3$ 234 are less likely to result in a read error than states $s_1$ 230 and $s_2$ 232, because their distributions 202 and 208 are further from the intersection of distributions 204, 206 associated with reference voltage $V_1$ 222. When reading the most significant bit, states $s_0$ 226 and $s_3$ 234 correspond to most significant bit value of 1, and states $s_1$ 230 and $s_2$ 232 correspond to most significant bit value of 0. To read the most significant bit pages, the decision criterion is different and a pair of reference voltages $V_0$ 220 and $V_2$ 224 are applied. The levels of reference voltages $V_0$ 220, $V_1$ 222 and $V_2$ 224 are supplied by a channel tracking module in some embodiments of the invention.

When reference voltages $V_0$ 220, $V_1$ 222 and $V_2$ 224 are used during a read to determine the state of the memory cell, it can result in a misread due to overlapping regions for neighboring distributions. For example, if the actual written state is $s_0$ corresponding to target state voltage level 212, but the readback voltage is at the upper edge of distribution 202 above reference voltage $V_0$ 220, the decision will incorrectly identify state $s_1$ 230. In these cases, if low density parity check decoding of the data read from the non-volatile memory does not converge on the correct values and correct the errors, a retry operation is initiated.

During the retry operation, the non-volatile memory controller enters into a soft low density parity check decoding operation, in which soft data is used as the input to the low density parity check decoder. In retry, multiple reads of a memory page are performed at different read reference voltages to obtain a quantized version of the stored voltage on the cell. Afterwards, the multiple read pattern for each bit is then mapped to a log likelihood ratio (LLR) that represents the confidence level of the bit value being 0 or 1. Finally, the log likelihood ratios are passed as the soft data input to the low density parity check decoder to recover the written data.

Figure 3:
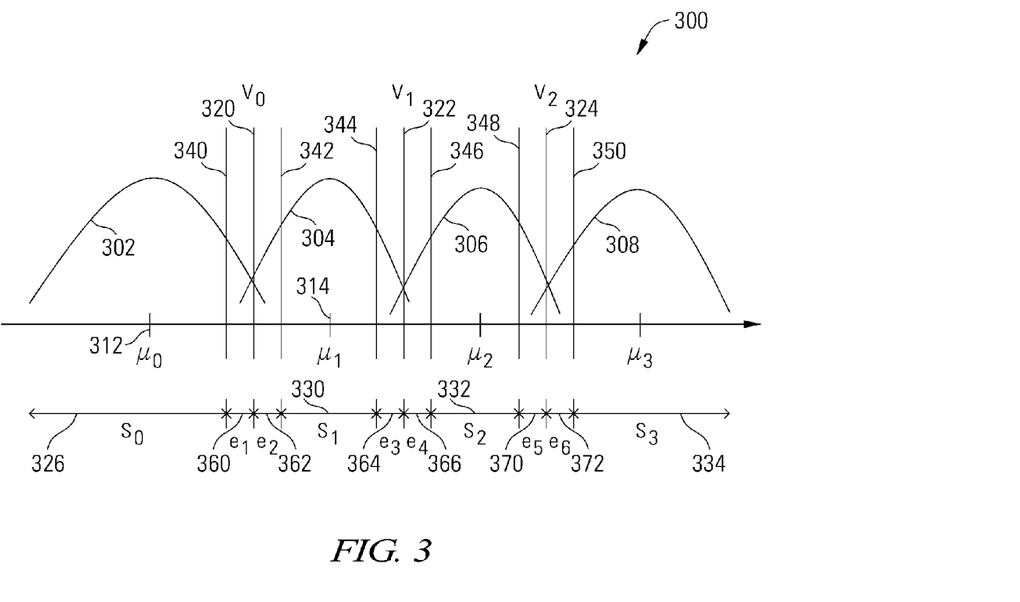
FIG. 3 depicts graph of cell voltage distributions for a retry soft decision read in accordance with some embodiments of the present invention.

Turning to FIG. 3, a graph 300 shows distributions 302, 304, 306, 308 for cell voltages in different states for a retry soft decision read in accordance with some embodiments of the present invention. During retry reads, soft decision data is generated by applying additional reference voltages 340, 342, 344, 346, 348, 350 in addition to reference voltages $V_0$ 320, $V_1$ 322 and $V_2$ 324. By performing additional read operations using different reference voltages (e.g., 344, 346), additional regions or states are defined, such as main state $s_0$ 326, $s_1$ 330, $s_2$ 332, and $s_3$ 334, and new intermediate states $e_1$ 360, $e_2$ 362, $e_3$ 364, $e_4$ 366, $e_5$ 370, and $e_6$ 372. Each is assigned a state value (e.g., {111}, {011}, {001}).

For example, when reading a least significant bit page, reference voltages 344, 322, 346 are applied in a series of read operations to determine if the least significant bit is a '0', with the memory cell in either state $s_2$ 332, or $s_3$ 334, or if the least significant bit is a '1', with the memory cell in either state $s_0$ 326, $s_1$ 330. Given three reference voltages 344, 322, 346, the hard decisions will have three bit values. Although reference voltages can be applied in a number of different orders, affecting the hard decision results, one example of the hard decision values for three reference voltages 344, 322, 346 applied in that order is as follows. If the readback voltage is below all three reference voltages 344, 322, 346 to the left of reference voltage 344, the hard decision is {111}. If the readback voltage is above reference voltage 344 and below reference voltages 322, 346, the hard decision is {011}. If the readback voltage is above reference voltages 344, 322 and below reference voltage 346, the hard decision is {001}. If the readback voltage is above all three reference voltages 344, 322, 346, the hard decision is {000}. The hard decision can be generated bit by bit by applying each of the three reference voltages 344, 322, 346 in three successive read operations.

When reading a most significant bit page, reference voltages 340, 320, 342 and 348, 324, 350 are applied in a series of read operations to determine if the most significant bit is a '0', with the memory cell in either state $s_1$ 330 or $s_2$ 332, or if the most significant bit is a '1', with the memory cell in either state $s_0$ 326 or $s_3$ 334. If the readback voltage is below reference voltage 340, the hard decision is {111}. If the readback voltage is between reference voltages 340 and 320, the hard decision is {011}. If the readback voltage is between reference voltages 320 and 342, the hard decision is {001}. If the readback voltage is between reference voltages 342 and 348, the hard decision is {000}. If the readback voltage is between reference voltages 348 and 324, the hard decision is {100}. If the readback voltage is between reference voltages 324 and 350, the hard decision is {110}. If the readback voltage is above reference voltage 350, the hard decision is {111}.

Notably, the likelihood that the value read from a memory cell is correct differs based on the state that is read. For example, if the retry read results in a hard decision corresponding to state $s_0$ 326, the likelihood that the memory cell actually contains the value associated with target state voltage level 312 is greater than if the retry read results in a hard decision corresponding to state $e_1$ 360, because state $s_0$ 326 is further from the intersection of distributions 302 and 304 than state $e_1$ 360.

The hard decisions of read operations can be converted into soft decisions (log likelihood ratio values) based on the knowledge of the channel. The hard decision for state $s_0$ 326 will therefore have a higher log likelihood value than the hard decision for state $e_1$ 360. A log likelihood ratio for a memory cell contains the likelihood for each possible value of the memory cell that the cell contains that value. Thus, given a four state memory cell, the corresponding log likelihood ratio for data stored in the memory cell will have four probability or likelihood values, each giving the likelihood that the memory cell contains one of the four possible values. The log likelihood ratio values are generated from the retry read operation hard decisions in any suitable manner. Based upon the disclosure provided herein, one of ordinary skill in the art will recognize a variety of techniques and equations for calculating log likelihood ratio values from the retry read operation hard decisions. In some embodiments, the log likelihood ratio values are pre-calculated for each possible retry read operation hard decision, based on expected channel characteristics, and stored in a lookup table for use during operation.

In some embodiments, when data from a retry read operation fails to converge in the decoder, another retry read operation is triggered, with a greater number of reference voltages applied, giving higher quality soft decisions to be provided to the decoder. Such a process of increasing the number of reference voltages can be continued as long as desired until a maximum number of retries is reached and a read failure is signaled.

However, the benefit of merely adding additional reference voltages and mapping the resulting read results to log likelihood ratios is limited by the limited resolution of the log likelihood ratios. For example, if the log likelihood ratios are represented by 4-bit signed integers, each log likelihood ratios can only take on 16 possible values. The adjustment of retry read reference voltages disclosed herein adjusts the reference voltages to achieve a prescribed log likelihood ratio table that is designed to achieve low density parity check decoding convergence with a lower number of read retries. This fully utilizes the high resolution of read reference voltage settings compared to the limited design space of the log likelihood ratios representing the soft information.

Initially, the location of the intersections between distributions (e.g., 302, 304) is not known. If the read reference voltages are positioned so that read values are captured near the center of distributions (e.g., 302), the full range of the resulting log likelihood ratios will not be used and the hard read bit error rate will not be minimized. For example, if log likelihood ratios are represented using 3 signed bits, the range of possible log likelihood ratios is from −7 to 7. Channel tracking is performed and an algorithm is applied to inversely find the read reference voltages that will use the full resolution of possible log likelihood ratios, rather than concentrating the log likelihood ratios at the edges of the available range.

In some embodiments, the channel tracking-based read reference voltage adjustment disclosed herein is applied in a retry operation. In these embodiments, a hard read is performed first, reading hard decisions and decoding those hard decisions. The hard decisions can be mapped to log likelihood ratio values for a low density parity check decoder with a soft information input, by mapping a 0 value from the memory cell to a large negative log likelihood ratio value corresponding to a 0 value, and mapping a 1 value from the memory cell to a large positive log likelihood ratio value corresponding to a 1 value.

If the decoding fails, then the retry operation is initiated, and a soft read is performed, yielding soft information or log likelihood ratios that are decoded. In a soft read, multiple reads of a page are performed at different read reference voltages to obtain a quantized version of the stored voltage on the memory cell. The multi-bit read patterns from the memory cell are mapped to log likelihood ratios that represent the confidence level of the bit value being 0 or 1, using a lookup table. The log likelihood ratios are passed to a decoder, such as, but not limited to, a low density parity check decoder performing soft decoding, to recover the written data. An algorithm is implemented to inversely identify the reference voltages that will populate the lookup table, under the assumption that the read voltage distributions have a substantially Gaussian distribution.

In some embodiments, the algorithm to inversely identify the reference voltages that will populate the lookup table to map to log likelihood ratios is a greedy algorithm, meaning that it considers all possible values of the read reference voltages before reaching a solution for the read reference voltages to be used. It is also an inverse algorithm, meaning that it starts with the possible log likelihood ratios and then identifies the read reference voltages that will result in quantized voltages that map to log likelihood ratios that use the full resolution. By utilizing the full log likelihood ratio resolution, the low density parity check decoding is able to converge on the correct written values in a lower number of read retries. With proper choice of read reference voltages, it is observed that the limited spectrum of log-likelihood ratios does not impair performance of the low-density parity-check decoder. In some embodiments, the low density parity check decoding comprises a min-sum decoding algorithm, although the channel tracking-based retry read voltage adjustment is not limited to use with any particular type of decoder.

Figure 4:
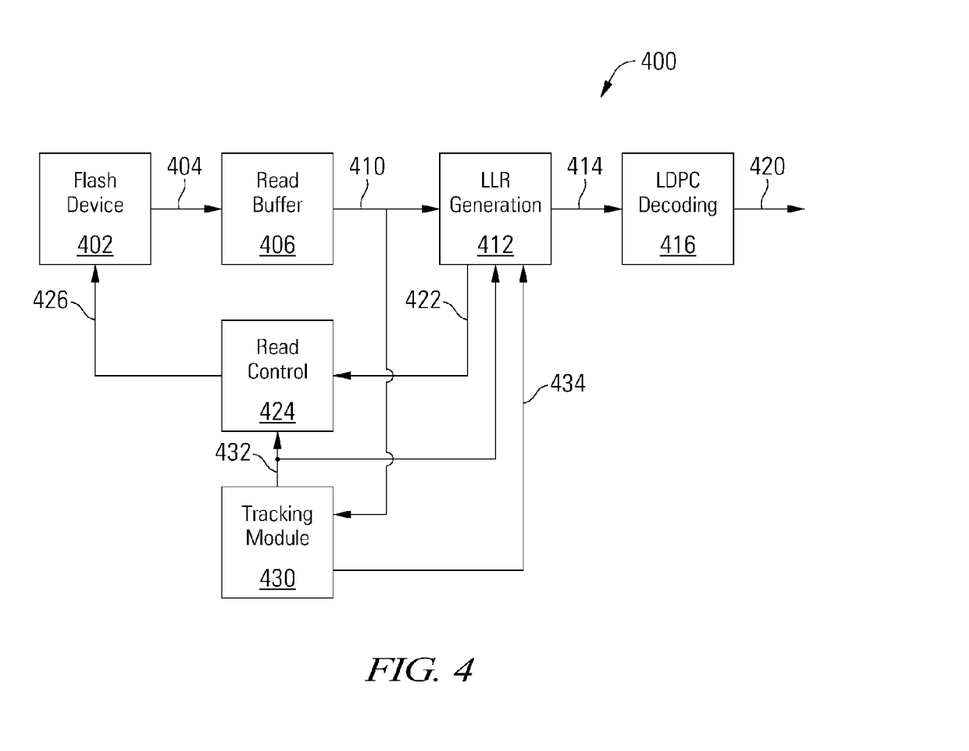
FIG. 4 depicts a flash channel read path with channel tracking-based retry read voltage adjustment in accordance with some embodiments of the present invention.

Turning to FIG. 4, a flash channel read path 400 with channel tracking-based retry read voltage adjustment is depicted in accordance with some embodiments of the present invention. The read path 400 includes a flash device having an array of memory cells, or any other type of non-volatile memory. Based upon the disclosure provided herein, one of ordinary skill in the art will recognize a variety of storage technologies that can benefit from the channel tracking-based retry read voltage adjustment disclosed herein.

Read reference voltages 426 are applied to the flash device 402 by a read control device 424 in a series of N reads. Each memory cell is read N times, and the N reads result in read data 404 containing N bits per memory cell as a quantized version of the stored voltage on the memory cell. The read data 404 is buffered in a read buffer 406, and buffered read data 410 from read buffer 406 is provided to a log likelihood ratio generation circuit 412 (or likelihood generator, which can also be adapted to use plain likelihood values). The N bits for a memory cell are mapped to log likelihood ratios for the memory cell in log likelihood ratio generation circuit 412. In some embodiments, the log likelihood ratio generation circuit 412 contains a lookup table that maps the read patterns in buffered read data 410 to log likelihood ratios.

A tracking module 430 receives the buffered read data 410 from the read buffer 406, or from any other suitable source. The tracking module 430 identifies the intersection point between neighboring voltage distributions (e.g., 302, 304) for a memory cell that corresponds to zero log likelihood ratio, and provides read reference voltage level $V_{REF0}$ 432, including the read reference voltage $V_{REF0}$ corresponding to the intersection. When the read reference voltage $V_{REF0}$ corresponding to the intersection is used for the soft read operation, it will result in a reduction in the bit error rate. The read reference voltage $V_{REF0}$ is used in some embodiments as the first read reference voltage of a retry read operation (see, e.g., 320), and additional read reference voltages around $V_{REF0}$ to obtain all possible log likelihood ratio values. The tracking module 430 thus generates the read reference voltage level $V_{REF0}$ 432 to be used in retry read operations. In other embodiments $V_{REF0}$ may not correspond to the intersection of the distributions depending on the tracking algorithm design, tracking inaccuracy, or the actual channel distributions deviating from Gaussian behavior in either the peak or the tail. In other situations, $V_{REF0}$ may coincide with the intersection of the distributions but may not be applied first and that would be accounted for in the calculations in 412 and 424.

The tracking module 430 also tracks the voltage distributions (e.g., 302, 304), calculating the means (e.g., $\mu_0$ 312, $\mu_1$ 314, etc) and the variances $\sigma_0$, $\sigma_1$ for at least some voltage distributions (e.g., 304, 306). Given the assumption that the voltage distributions (e.g., 304, 306) have a Gaussian distribution, the voltage distribution means and variances 434 identifies the intersection points between neighboring distributions. In some embodiments, the tracking module 430 calculates the voltage distribution means and variances 434 for each voltage distribution corresponding to each possible state in each memory cell. In some other embodiments, the tracking module 430 calculates the voltage distribution means and variances 434 for each voltage distribution corresponding to each possible state in groups of memory cells. The voltage distribution means and variances 434 can be calculated in any suitable manner based on the read data. As an example, the tracking module 430 can operate as disclosed in U.S. patent application Ser. No. 13/533,130, filed Jun. 26, 2012 for "FAST TRACKING FOR FLASH CHANNELS", which is incorporated herein by reference for all purposes. Based upon the disclosure provided herein, one of ordinary skill in the art will recognize a variety of techniques for calculating means and variances based on data sampled from Gaussian distributions. However, the tracking module 430 is not limited to any particular tracking algorithm. For example, in some other embodiments, the tracking module 430 tracks intersections without estimating means or variances. Even in cases where means and variances are not or cannot be tracked, in some embodiments, a pre-characterized table of means and variances for the purpose of determining reference voltages is used. In instances where the likelihood map is altered dynamically, reference voltage gaps are computed dynamically as well. Thus, the phrase "calculating means and variances" herein also refers to embodiments using pre-characterized tables of means and variances.

For a two-state memory cell, or single-level memory cell, the tracking module 430 estimates the means and variances of the voltage distributions of states '1' and '0', as well as the read reference voltage $V_{REF0}$ that most reduces the bit error rate and which likely lies at the intersection of those distributions when 0's and 1's are equally likely in the written data.

The tracking module 430 provides the voltage distribution means and variances 434 to the log likelihood ratio generation circuit 412 for use in updating the log likelihood ratio lookup table. The log likelihood ratio generation circuit 412 is used to calculate likelihood values for decoding purposes. The log likelihood ratio generation circuit 412 also determines where to place the other N−1 read reference voltages around $V_{REF0}$ 432 based on the voltage distribution means and variances 434 and on the read reference voltage $V_{REF0}$ 432 to obtain all possible log likelihood ratio values when the read patterns in buffered read data 410 are mapped to log likelihood ratios. The log likelihood ratio generation circuit 412 determines where to place the other N−1 read reference voltages around $V_{REF0}$ 432, updates the lookup table, and provides the N−1 read reference voltage levels 422 to a read controller 424. It is important to note that the division of functionality is not limited to the example embodiments disclosed herein. For example, in other embodiments, the tracking module 430 calculates and provides read reference voltages around $V_{REF0}$ 432 and provides those voltages to the log likelihood ratio generation circuit 412, rather than the log likelihood ratio generation circuit 412 determining where to place the other N−1 read reference voltages around $V_{REF0}$ 432, and these divisions of functionality are to be seen as equivalent.

The channel tracking-based retry read voltage adjustment algorithm is implemented in the log likelihood ratio generation circuit 412 based on the channel tracking information provided by the tracking module 430. The read reference voltages are stored in log likelihood ratio generation circuit 412 in some embodiments, as calculated based on the log likelihood ratio lookup table in log likelihood ratio generation circuit 412 and on the voltage distribution means and variances 434 from tracking module 430.

The read controller 424 controls the retry read operations in the flash device 402, providing each of the N read reference voltages (including $V_{REF0}$ 432) to be used when reading the memory cells in the flash device 402. The read controller 424 initiates N reads of a page, with the first read using read reference voltage $V_{REF0}$ in some embodiments, and with the subsequent N−1 reads at read references voltages around $V_{REF0}$ as determined by log likelihood ratio generation circuit 412.

As an example for a single-level memory cell, the bits are stored at two possible threshold voltages. The threshold voltages levels follow the Gaussian probability density function with equal variances for a centered intersection. The levels, denoted by logical 0 and 1, have means $\mu_0 = -1$ v and $\mu_1 = 1$ v, respectively, which can be found by channel tracking. The optimal read reference voltage $V_{REF0}$ can be found in this example by channel tracking to be at 0 v. A low density parity check decoder is used to decode the least significant bit pages using a soft decoding algorithm, using a 4-bit log likelihood ratio having a range [−8, 7], although other fixed point representations can also be used.

For the first retry read, the log likelihood ratio generation circuit 412 places the reference voltage at 0 v. This reference voltage is in the middle where the voltage distributions intersect and are equal so that the read result is equally likely to be in either state, and this read result is mapped to log likelihood ratio 0. This allows read reference voltages to be positioned in subsequent retry reads around $V_{REF0}$ to fully use the log likelihood ratio resolution and range. Thus, in the first retry read in some embodiments, the reference voltage is placed at 0 v, and the log likelihood ratio constellation, the log likelihood ratio values to which the resulting two-state read data is mapped, is $\{-6, 6\}$.

For the second retry read in some embodiments, the log likelihood ratio constellation is set at $\{-7, -2, 5\}$ to provide both small and large negative log likelihood ratios and relatively large positive log likelihood ratios. An additional reference voltage is set at a voltage offset $\Delta_1 = 80/256$ v with respect to the first reference voltage, and is obtained as follows:

$$\log \frac{1 - Q\left(\frac{1}{\sigma}\right)}{Q\left(\frac{1}{\sigma}\right)} = \frac{5}{2} \log \frac{Q\left(\frac{1-\Delta_1}{\sigma}\right)}{Q\left(\frac{1}{\sigma}\right)}$$

where σ is the variance identified by the tracking module 430, the means are assumed to be −1 and +1, and Q is the tabulated Q function, the tail probability of the standard normal distribution, and the probability that a normal (Gaussian) random variable will obtain a value larger than x standard deviations above the mean.

Thus, the second retry read includes reads using $V_{REF0}$ and the additional reference voltage set at $V_{REF0} + \Delta_1$. The two reference voltages result in read data representing three possible states, which are mapped to the three-entry log likelihood ratio constellation.

Decoding is performed on the log likelihood ratios resulting from the second retry read, and if low density parity check decoding successfully converges, the read operation is finished. Otherwise, a third retry read can be initiated.

For the third retry read in some embodiments, the log likelihood ratio constellation is set at $\{-7, -2, 2, 7\}$ to provide both small and large negative and positive log likelihood ratios. An additional reference voltage is set at $\Delta_2 = -80/256$ v. Thus, the third retry read includes reads using $V_{REF0}$ and the additional reference voltages set at $V_{REF0} + \Delta_1$ and $V_{REF0} + \Delta_2$. The three reference voltages result in read data representing four possible states, which are mapped to the four-entry log likelihood ratio constellation.

Decoding is performed on the log likelihood ratios resulting from the third retry read, and if low density parity check decoding successfully converges, the read operation is finished. Otherwise, a fourth retry read can be initiated.

For the fourth retry read in some embodiments, the log likelihood ratio constellation is set at {−7, −3, −1, 2, 7}. The reference voltage is set at Δ1=50/256 v, which is obtained as follows:

$$\log \frac{Q\left(\frac{1-\Delta_3}{\sigma}\right)}{Q\left(\frac{1}{\sigma}\right)} = \frac{1}{2} \log \frac{Q\left(\frac{1-\Delta_1}{\sigma}\right)}{Q\left(\frac{1}{\sigma}\right)}$$

where Q is the tabulated Q function.

Thus, the fourth retry read includes reads using $V_{REF0}$ and the additional reference voltages set at $V_{REF0}+\Delta 1$, $V_{REF0}+\Delta 2$, and $V_{REF0}+\Delta 3$. The four reference voltages result in read data representing five possible states, which are mapped to the five-entry log likelihood ratio constellation.

Decoding is performed on the log likelihood ratios resulting from the fourth retry read, and if low density parity check decoding successfully converges, the read operation is finished. Otherwise, a fifth retry read can be initiated, following the pattern of adding additional reference voltages, until the log likelihood ratio constellation includes every possible value within the log likelihood ratio range. The number of retry reads performed is not limited to any particular number. After performing a desired number of retry reads in an attempt to correctly read and decode the data written to the memory cells, if decoding has not succeeded, a read fault can be indicated and the operation terminated or additional error recovery operations can be initiated.

In summary, a constellation of log likelihood ratios is selected, corresponding to the range of log likelihood ratio values that is desired in the read results, and the reference voltage levels that can result in those log likelihood ratio values are calculated, based on means and variances obtained through channel tracking Thus, the multi-bit read patterns are mapped to predetermined log likelihood ratios that have the desired spacing within the log likelihood ratio range, rather than calculating log likelihood ratios for read patterns resulting from uniformly spaced read reference voltages.

The channel-tracking based retry read voltage adjustment disclosed herein allows a more complete use of the resolution of the log likelihood ratios, improving the placement of the reference voltages to result in read data with patterns that map to log likelihood ratios that are not concentrated in relatively small portions of the log likelihood ratio range. By selecting the reference voltages for the retry reads, the chances of early decoding success are improved and the overall throughput is increased. Dynamic selection of read reference voltages gives the ability to adjust or adapt to changing channel conditions. In effect, channel quality information is extracted from tracking estimates to effectively select read-retry voltages.

Figure 5:
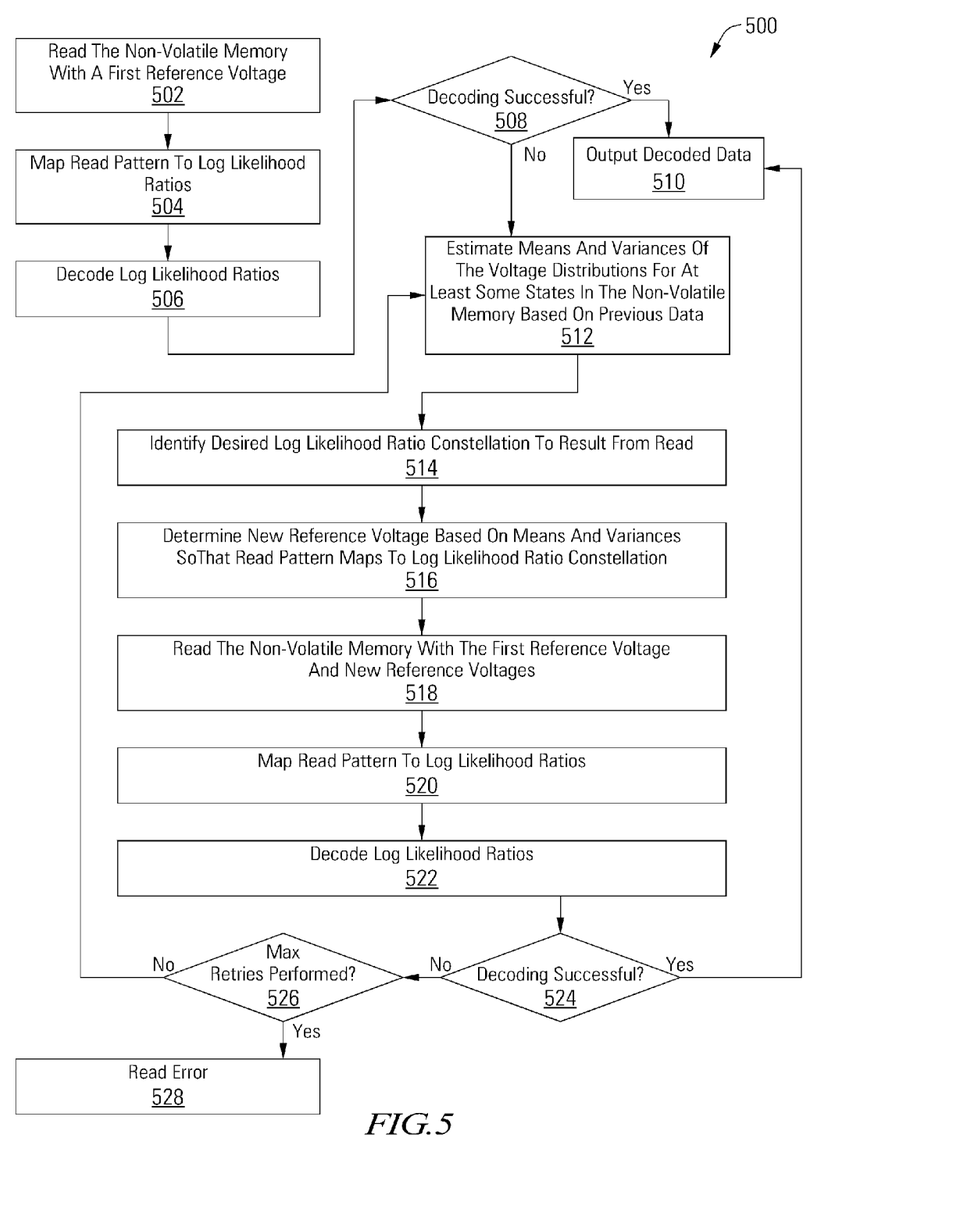
FIG. 5 depicts a flow diagram of an operation for reading data from a non-volatile memory in accordance with one or more embodiments of the present invention.

Turning to FIG. 5, a flow diagram 500 depicts an operation for reading data from a non-volatile memory in accordance with one or more embodiments of the present invention. In some embodiments, an initial hard decision read can be performed on the non-volatile memory with the resulting hard decisions decoded in a decoder such as, but not limited to, a low density parity check decoder. In these embodiments, if the decoding fails, the operation of flow diagram 500 is initiated as a soft information retry read.

Following flow diagram 500, the non-volatile memory is read using a first reference voltage. (Block 502) The non-volatile memory can comprise any type of memory, such as, but not limited to, a flash device. The first reference voltage is set in some embodiments at a level that reduces or minimizes bit error rate, such as a 0 v intersection between voltage distributions for equally likely states at −1 v and 1 v. The resulting read pattern is mapped to log likelihood ratios. (Block 504) The log likelihood ratios are decoded. (Block 506) In some embodiments, the data written to the non-volatile memory has been encoded with a low density parity check encoder, and the decoding is performed with a low density parity check decoder. A determination is made as to whether the decoding was successful. (Block 508) For example, a parity check syndrome can be calculated in the decoder representing the number of failed parity checks, and if that number is 0, or below some threshold, the decoding is determined to have successfully converged on the correct data values. If so, the data is output. (Block 510)

If the decoding was not successful, another read retry can be initiated. The means and variances of the voltage distributions for at least some states in the non-volatile memory are estimated based on previous data or the estimates from the first retry is still used. (Block 512) In some embodiments, the means and variances of the voltage distributions for every possible state are estimated, giving the voltage levels at the intersections between each pair of voltage distributions.

The desired log likelihood ratio constellation to result from the read is identified. (Block 514) The log likelihood ratio constellation is the set of target log likelihood ratio values that are desired to appear in the read results after mapping the read pattern to log likelihood ratios. In some embodiments, the log likelihood ratio constellations are predetermined for each number of reference voltages applied in retry reads. Although a uniform spacing between the log likelihood ratio values in the read results is not necessary, generally the full range or substantially the full range of log likelihood ratio values is used to facilitate decoding. In some embodiments, the number of entries in the log likelihood ratio constellation is one more than the total number of read reference voltages used in the read.

A new or secondary reference voltage is determined based on the means and variances so that the read pattern maps to the log likelihood ratio constellation. (Block 516) The non-volatile memory is read using the first reference voltage and each subsequently calculated or secondary reference voltage. (Block 518) The resulting read pattern is mapped to log likelihood ratios. (Block 520) In some embodiments, the mapping is performed using a lookup table to correlate read patterns with log likelihood ratios, where the mappings in the look up table are selected to increase the probability of convergence in the decoder. The log likelihood ratios are decoded. (Block 522) A determination is made as to whether the decoding was successful. (Block 524) If so, the data is output. (Block 510) Otherwise, a determination is made as to whether the maximum number of retries has been performed. (Block 526) If the maximum number of retries has been performed, a read error can be flagged. (Block 528) Otherwise, the retry read process proceeds at block 512, increasing the number of entries in the log likelihood ratio constellation and adding an additional read reference voltage before performing another read.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, embodiments of the present invention provide novel systems, devices, methods and arrangements for adjusting retry read voltage in a non-volatile memory based on channel tracking. While detailed descriptions of one or more embodiments of the invention have been given above, various alternatives, modifications, and equivalents will be apparent to those skilled in the art without varying from the spirit of the invention. Therefore, the above description should not be taken as limiting the scope of embodiments of the invention which are encompassed by the appended claims.

What is claimed is:

1. A device comprising:
   a circuit configured to:
   receive read data from a non-volatile solid state memory;
   determine a log likelihood ratio (LLR) based on the read data determine a data value based on the LLR, determine if decoding was successful, and output data when the decoding was successful;
   calculate means and variances of voltage distributions of the non-volatile solid state memory;
   provide the means and variances to an LLR generation circuit to update a LLR lookup table that maps read patterns in the read data to LLRs;
   implement a retry read operation when the decoding was not successful, the retry read operation includes adjusting a read voltage of a non-volatile solid state memory based on the means and variances of the voltage distributions of the non-volatile solid state memory; and
   perform a read, utilizing the read voltage, of a memory cell of the non-volatile solid state memory to generate retry read data.

2. The device of claim 1 further comprising the circuit configured to determine the means and variances of the voltage distributions based on estimating means and variances of the voltage distributions for different data states in the non-volatile solid state memory.

3. The device of claim 1 further comprising a decoder including a low density parity check decoder configured to perform error correction for the decoding.

4. The device of claim 3 further comprising the low density parity check decoder configured to decode an initial hard decision.

5. The device of claim 4 further comprising the decoder configured to:
determine if decoding of the hard decision failed; and
if decoding of the hard decision failed, then the decoder is configured to implement a soft low density parity check decoding operation, in which soft data is used as an input to the low density parity check decoder.

6. The device of claim 5 further comprising the decoder configured to perform a read retry of the data, the read retry including multiple reads of a memory page performed at different read reference voltages to obtain a quantized version of a stored voltage on a cell.

7. The device of claim 6 further comprising the decoder configured to determine soft data corresponding to the read retry, the soft data including a confidence level of a bit value determined based on the multiple reads.

8. A method comprising:
providing an estimate of voltage distributions of a non-volatile solid state memory to a log likelihood ratio (LLR) lookup table that maps read patterns in read data to LLRs;
adjusting a read voltage of the non-volatile solid state memory based on the estimate of voltage distributions of the non-volatile solid state memory;
performing a read, utilizing the read voltage, of a memory cell of the non-volatile solid state memory to generate a read pattern; and
providing the estimate to an LLR generation circuit to update a LLR lookup table.

9. The method of claim 8 further comprising:
reading the memory cell with a first reference voltage to determine a read pattern;
mapping the read pattern to a log likelihood ratio;
decoding the log likelihood ratio;
determining if the decoding was successful; and
performing a read retry when the decoding was not successful.

10. The method of claim 8, further comprising:
calculating means and variances of a voltage distribution in the non-volatile solid state memory;
calculating at least one secondary reference voltage at an offset to a first reference voltage based at least in part on the means and variances and on a set of target likelihood values;
reading the non-volatile memory using the first reference voltage and the at least one secondary reference voltage to yield a read pattern; and
mapping the read pattern to likelihood values.

11. The method of claim 10, further comprising decoding the likelihood values to identify values of the data in the non-volatile memory.

12. The method of claim 11, further comprising:
determining if the decoding the likelihood values was successful; and
performing another read when the decoding was not successful, the another read based on at least one more secondary reference voltage.

13. The method of claim 12, further comprising:
determining if a maximum number of read retries have been attempted;
permitting another read retry when the maximum number of read retries have not been attempted; and
providing a read error when the maximum number of read retires has been attempted.

14. An apparatus comprising:
a buffer configured to store read data from a non-volatile solid state memory;
a log likelihood ratio (LLR) generation circuit configured to determine a LLR based on the read data;

a decoder configured to determine a data value based on the LLR, determine if decoding was successful, and output data when the decoding was successful; and a read control configured to implement a retry read operation when the decoding was not successful, the retry read operation includes adjusting a read voltage of the non-volatile solid state memory based on an estimate of voltage distributions of the non-volatile solid state memory; and a tracking module configured to:

determine the read voltage to be used in the retry read operation by:

calculating means and variances of voltage level distributions in the non-volatile solid state memory; and calculating the read voltage based on the means and variances;

provide the means and variances to the LLR generation circuit to update a LLR lookup table that maps read patterns in the read data to log likelihood ratios.

15. The apparatus of claim 14 further comprising a likelihood generator configured to:

select a constellation of log likelihood ratios corresponding to a range of log likelihood ratio values that is desired in the read data;

calculate secondary reference voltage levels that can result in the log likelihood ratio values based on the means and variances; and where during the read retry the non-volatile solid state memory is read using the read voltage and each secondary reference voltage.

16. The apparatus of claim 15 further comprising the likelihood generator configured to, when the decoding was not successful, increase a number of entries in the log likelihood ratio constellation and adding an additional read reference voltage before performing another read retry.

* * * * *